United States Patent
Choi

(10) Patent No.: US 8,063,680 B2
(45) Date of Patent: Nov. 22, 2011

(54) DELAY LOCKED LOOP CIRCUIT AND SEMICONDUCTOR MEMORY DEVICE INCLUDING THE SAME

(75) Inventor: Jung-Hwan Choi, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/686,633

(22) Filed: Jan. 13, 2010

(65) Prior Publication Data
US 2010/0194457 A1  Aug. 5, 2010

(30) Foreign Application Priority Data

Feb. 2, 2009  (KR) .................. 10-2009-0007858

(51) Int. Cl.
*H03L 7/06* (2006.01)

(52) U.S. Cl. ...................................... 327/158; 327/175
(58) Field of Classification Search .................. None
See application file for complete search history.

(56) References Cited

U.S. PATENT DOCUMENTS

| | | | | |
|---|---|---|---|---|
| 5,572,158 | A * | 11/1996 | Lee et al. | 327/175 |
| 7,015,739 | B2 * | 3/2006 | Lee et al. | 327/175 |
| 7,199,634 | B2 * | 4/2007 | Cho et al. | 327/175 |
| 7,528,668 | B2 * | 5/2009 | Kim et al. | 331/45 |
| 7,567,106 | B2 * | 7/2009 | Park et al. | 327/175 |
| 7,825,711 | B2 * | 11/2010 | Ma | 327/158 |
| 2003/0052719 | A1 * | 3/2003 | Na | 327/158 |
| 2007/0152723 | A1 * | 7/2007 | Ahn et al. | 327/158 |

FOREIGN PATENT DOCUMENTS

| | | |
|---|---|---|
| JP | 2000-306399 | 11/2000 |
| KR | 1020080038502 | 5/2008 |
| KR | 1020080074667 | 8/2008 |

\* cited by examiner

*Primary Examiner* — Cassandra Cox
(74) *Attorney, Agent, or Firm* — F. Chau & Associates, LLC

(57) ABSTRACT

A delay locked loop circuit includes: a delay locked loop block receiving an external clock and generating a delay locked internal clock; a duty cycle correcting block connected to the delay locked loop block and correcting the duty cycle of the internal clock; and an error detecting unit comparing the voltages of first and second pumping output nodes of the duty cycle correcting block to detect an operation error of the duty cycle correcting block.

20 Claims, 3 Drawing Sheets

US 8,063,680 B2

DELAY LOCKED LOOP CIRCUIT AND SEMICONDUCTOR MEMORY DEVICE INCLUDING THE SAME

CROSS-REFERENCE TO RELATED APPLICATIONS

This application claims priority to Korean Patent Application 10-2009-0007858, filed on Feb. 2, 2009, in the Korean Intellectual Property Office, the disclosure of which is incorporated by reference herein.

BACKGROUND

1. Technical Field

Exemplary embodiments of the inventive concept relate to a delay locked loop circuit, and more particularly, to a delay locked loop circuit to detect an operation error of a corresponding duty cycle correcting block and a semiconductor memory device including the same.

2. Discussion of Related Art

A clock signal may be used as a reference signal in electronic systems or circuits to synchronize the processing of operations according to a desired schedule. However, the internal circuitry of a semiconductor device may introduce a time delay into a clock signal input externally, thereby causing a clock skew. A delay locked loop circuit may be used to compensate for the time delay to ensure that the internal clock signal and the external clock signal have the same phase.

In the operation of certain semiconductor circuits, maintaining the duty ratio of the rising period to the falling period of the clock may have a higher priority than ensuring that the delay of the clock be locked to a particular delay value. Accordingly, certain semiconductor circuits may include a duty cycle correcting function.

However, even after a duty cycle correcting function is used, a duty correction error may be caused by a variation in process, voltage, and temperature (PVT), thereby resulting in a phase delay.

It is desirable that a correction circuit implementing the duty cycle correction be able to generate an internal clock having a constant duty ratio regardless of the duty ratio of an external clock. However, when the correction circuit is shorted to a ground voltage or a power supply voltage, it can be difficult to maintain an internal clock having a constant duty ratio.

SUMMARY

At least one exemplary embodiment of the inventive concept provides a delay locked loop circuit capable of detecting the operation error of a duty cycle correcting block connected to a delay locked loop block and a semiconductor memory device including the same.

At least one exemplary embodiment of the inventive concept provides a delay locked loop circuit capable of detecting whether the voltage output of a duty cycle correcting block is fixed to a constant value and a semiconductor memory device including the same.

At least one exemplary embodiment of the inventive concept provides a technique for preventing an operation error from occurring when a defective delay locked loop circuit is mounted to a semiconductor circuit.

A delay locked loop circuit according to an exemplary embodiment of the inventive concept includes: a delay locked loop block, a duty cycle correcting block, and an error detecting unit. The delay locked loop block receives an external clock and generates a delay locked internal clock. The duty cycle correcting block is connected to the delay locked loop block and corrects the duty cycle of the internal clock. The error detecting unit compares voltages of first and second pumping output nodes of the duty cycle correcting block to detect an operation error of the duty cycle correcting block.

The delay locked loop block may include: a delay cell unit, a phase detecting unit, and a control unit. The delay cell unit delays the external clock in response to an applied delay control signal. The phase detecting unit detects a phase difference between the internal clock and the external clock. The control unit applies the delay control signal to the delay cell unit in response to an output of the phase detecting unit.

The duty cycle correcting block may include: a duty cycle correction amplifying unit and a duty cycle correction pumping unit. The duty cycle correction amplifying unit corrects the duty cycle of the internal clock output from the delay locked loop block in response to an applied correction control signal. The duty cycle correction pumping unit receives the corrected internal clock output from the duty cycle correction amplifying unit and outputs the correction control signal.

The error detecting unit may include: a comparator, a latch, and an output buffer. The comparator compares the voltages of the first and second pumping output nodes of the duty cycle correcting block in response to a first enable signal. The latch latches the output of the comparator in response to a second enable signal. The output buffer buffers the output of the latch and applies the buffered output to an output pad, which is the external terminal. The error detecting unit may perform the detecting operation in response to an enable signal that is applied at the wafer level of a semiconductor chip.

A semiconductor memory device according to an exemplary embodiment of the inventive concept includes: a memory cell array including memory cells, a delay locked loop circuit including a duty cycle correcting block and an error detecting unit, and a read and write circuit. The delay locked loop block receives an external clock and generates a delay locked internal clock. The duty cycle correcting block is connected to the delay locked loop block and corrects the duty cycle of the internal clock. The error detecting unit compares the voltages of first and second pumping output nodes of the duty cycle correcting block, latches the comparison result, and outputs the comparison result to an external terminal to detect an operation error of the duty cycle correcting block. The read and write circuit reads and writes data from and to the memory cells of the memory cell array in response to the internal clock of the delay locked loop circuit.

The delay locked loop block may include: a delay cell unit, a phase detecting unit, and a control unit. The delay cell unit delays the external clock in response to an applied delay control signal. The phase detecting unit detects a phase difference between the internal clock and the external clock. The control unit applies the delay control signal to the delay cell unit in response to the output of the phase detecting unit.

The duty cycle correcting block may include: a duty cycle correction amplifying unit and a duty cycle correction pumping unit. The duty cycle correction amplifying unit corrects the duty cycle of the internal clock output from the delay locked loop block in response to an applied correction control signal. The duty cycle correction pumping unit receives the corrected internal clock output from the duty cycle correction amplifying unit and outputs the correction control signal.

The error detecting unit may include: a comparator, a latch, and an output buffer. The comparator compares the voltages of the first and second pumping output nodes of the duty cycle correcting block in response to a first enable signal. The latch latches the output of the comparator in response to a second enable signal. The output buffer buffers the output of the latch and applies the buffered output to an output pad, which is the external terminal.

When the memory cell is a dynamic random access memory cell, the error detecting unit may perform the detecting operation in response to an enable signal that is applied at the wafer level of a semiconductor chip.

A delay locked loop (DLL) circuit according to an exemplary embodiment of the present invention includes a delay cell unit, and amplifying unit, a charge pump, a phase detection unit, and an error detection circuit. The delay cell unit is configured to receive a first clock signal CK and a second clock signal CKB, delay the first and second clock signals CK and CKB, and output corresponding first and second delayed signals FCLK and RCLK. The second clock signal is an inverted version of the first clock signal. The amplifying unit is configured to correct the first delayed signal FCLK in response to a first correction signal and to correct the second delayed signal RCLK in response to a second correction signal and output corresponding first and second corrected clock signals CKI and CKIB. The charge pump is configured to generate the first and second correction signals in response to previous outputs of the amplifying unit and output the first correction signal to the amplifying unit along a first line to the amplifying unit and output the second correction signal to the amplifying unit along a second and distinct line to the amplifying unit. The phase detection unit is configured to detect a first phase difference between the first clock signal CK and the first corrected clock signal CKI, to detect a second phase difference between the second clock signal CKB and the second corrected clock signal CKIB, and to output the first and second phase differences to the delay cell unit. The error detection circuit is configured to determine and indicate whether the first line is shorted to the second line.

BRIEF DESCRIPTION OF THE DRAWINGS

The inventive concept will become more apparent by describing in detail exemplary embodiments thereof with reference to the attached drawings in which.

DETAILED DESCRIPTION OF EXEMPLARY EMBODIMENTS

Figure 1:
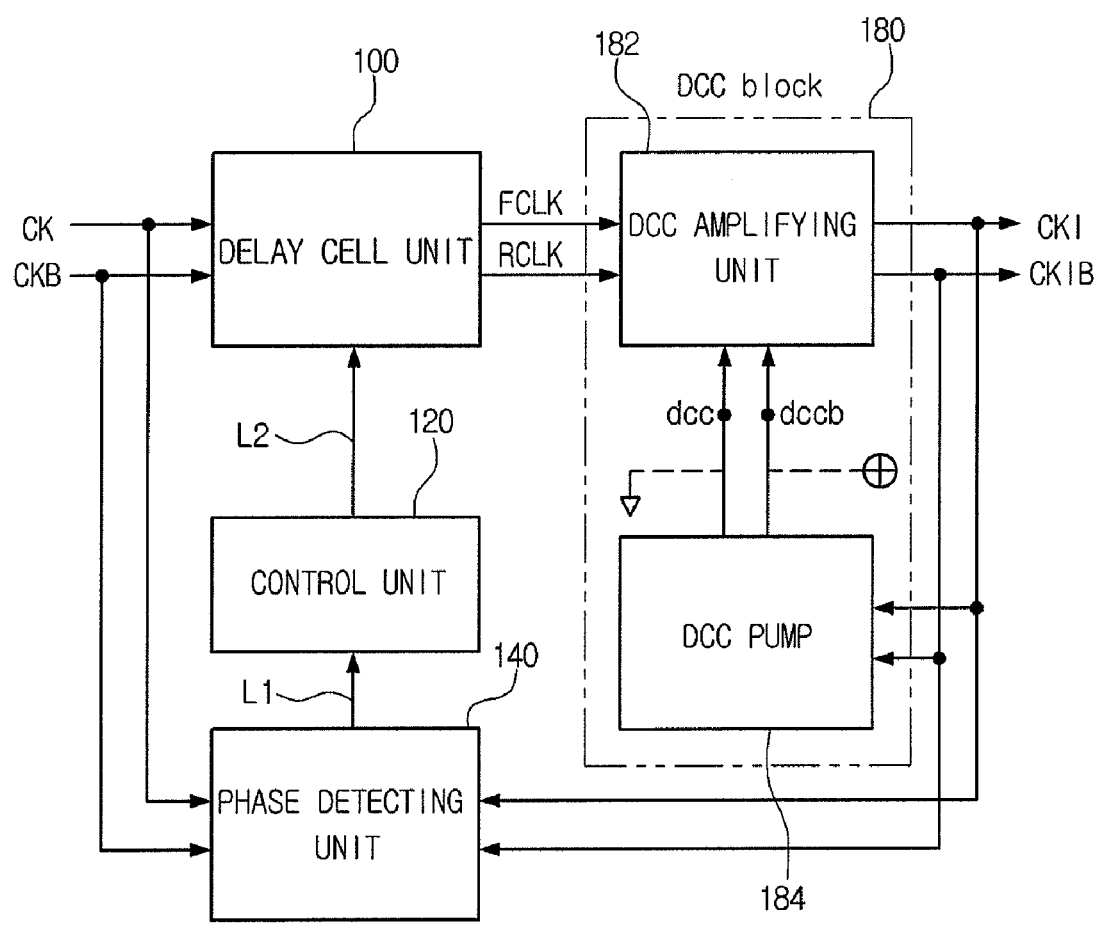
FIG. 1 is a functional block diagram illustrating a delay locked loop circuit.

Hereinafter, a delay locked loop circuit to detect an operation error of a corresponding duty cycle correcting block and a semiconductor memory device including the same according to exemplary embodiments of the inventive concept will be described with reference to the accompanying drawings. In the drawings, like numbers refer to like elements throughout the description.

Specific structural and functional details disclosed herein are merely representative for purposes of describing exemplary embodiments. Exemplary embodiments may, however, may be embodied in many alternate forms and should not be construed as limited to only the embodiments set forth herein.

It will be understood that when an element is referred to as being "connected" or "coupled" to another element, it can be directly connected or coupled to the other element or intervening elements may be present.

FIG. 1 is a functional block diagram illustrating a delay locked loop (DLL) circuit. Referring to FIG. 1, the DLL circuit includes a DLL block and a duty cycle correcting (DCC) block 180. The DLL circuit receives externals clocks CK and CKB and generates corresponding delay locked internal clocks CKI and CKIB. The DCC block 180 is connected to the DLL block and corrects the duty cycles of the internal clocks CK and CKB.

The DLL block includes a delay cell unit 100, a control unit 120, and a phase detecting unit 140. The delay cell unit 100 delays the external clocks CK and CKB in response to an applied delay control signal to output corresponding internal clocks FCLK and RCLK. The phase detecting unit 140 detects a phase difference between the internal clocks CKI and CKIB and the external clocks CK and CKB, and sends a corresponding detection signal through line L1 to the control unit 120. The control unit 120 applies the delay control signal to the delay cell unit 100 through line L2 in response to the detection signal output from the phase detecting unit 140.

The DCC block 180 includes a duty cycle correction (DCC) amplifying unit 182 and duty cycle correction (DCC) pump 184. The DCC amplifying unit 182 corrects the duty cycles of the internal clocks FCLK and RCLK output from the delay cell unit 100 in response to an applied correction control signal to generate corrected internal clocks CKI and CKIB. The DCC pump 184 receives the corrected internal clocks CKI and CKIB output from the DCC amplifying unit 182 and outputs the correction control signal.

Figure 2:
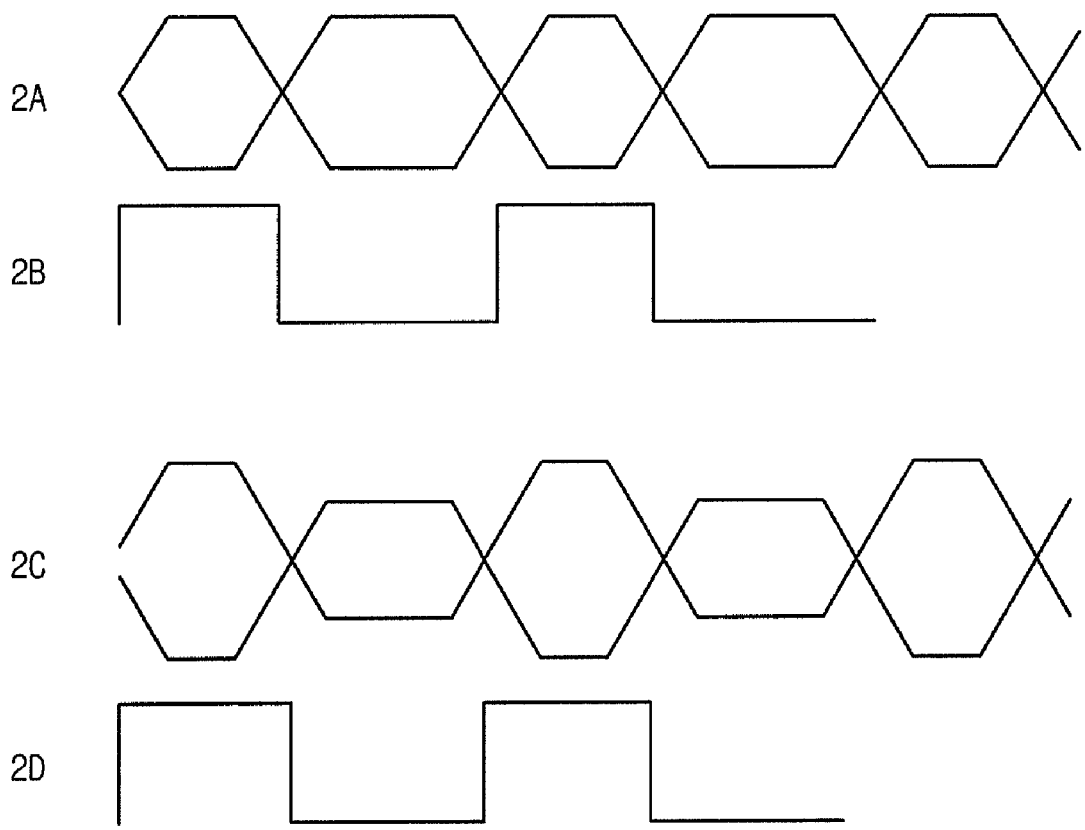
FIG. 2 is an operation timing chart related to FIG. 1.

FIG. 2 is an operation timing chart related to FIG. 1. Referring FIG. 2, waveforms 2A and 2B respectively indicate exemplary embodiments of the external clocks CK and CKB and the internal clocks CKI and CKIB having a duty ratio of about 40% when the duty cycle correcting block 180 is omitted in FIG. 1.

Waveforms 2C and 2D respectively indicate exemplary embodiments of the external clocks CK and CKB having a duty ratio of about 40% and the internal clocks CKI and CKIB having a duty ratio of about 50% when the duty cycle correcting block 180 is used in FIG. 1.

When the DLL circuit shown in FIG. 1 receives the external clocks CK and CKB and generates the internal clocks CKI and CKIB, the DLL circuit uses the DCC block 180 to correct the duty ratio of the external clocks CK and CKB and output the internal clocks CKI and CKIB at a constant duty ratio of 50%. The DCC block 180 supplies (e.g., pumps) a charge during the period for which a pulse is at a high level and feeds back the pumped charge in the common mode.

As shown in the clock waveforms 2A and 2B of FIG. 2, when the DCC block 180 is omitted, the duty ratio of the generated internal clocks CKI and CKIB follows the duty ratio of the external clocks CK and CKB, which are inputs corresponding to the internal clocks CKI and CKIB. However, as shown in FIG. 1, when the DCC block 180 is present, the DCC pump 184 integrates charge during the period for which the pulse is at a high level and reflects the integrated charge to the common mode of the clock. Therefore, as shown in the clock waveform 2C of FIG. 2, when the external clocks CK and CKB having a duty ratio of about 40% are input to the delay cell unit 100, the internal clocks CKI and CKIB having a duty ratio of 50% are output on the basis of a crossing point, as shown in the clock waveform 2D.

However, if an unintended bridge occurs in the first and second pumping output nodes dcc and dccb (e.g., if a short between nodes dcc and dccb occurs) of the DCC pump 184, a constant voltage is obtained at the first and second pumping output nodes dcc and dccb even though there is a variation in the input of the external clocks CK and CKB. In this example, the internal clocks CKI and CKIB have a duty ratio that is lower or higher than 50%. For example, when internal clocks CKI and CKIB having a duty ratio higher or lower than 50% are used for a semiconductor memory device, an operating margin may be insufficient or a high-frequency operation may be hindered.

One can measure the valid window of the clock using a measuring device to detect whether the duty ratio of the DCC block varies. For example, an oscilloscope can be used during mass production to measure this window. However, measurements taken in this manner may be time consuming and the reliability of the measured values varies according to the quality of the process used to take the measurements. As a result, operation errors may occur in a semiconductor circuit using the DLL circuit of FIG. 1.

Figure 3:
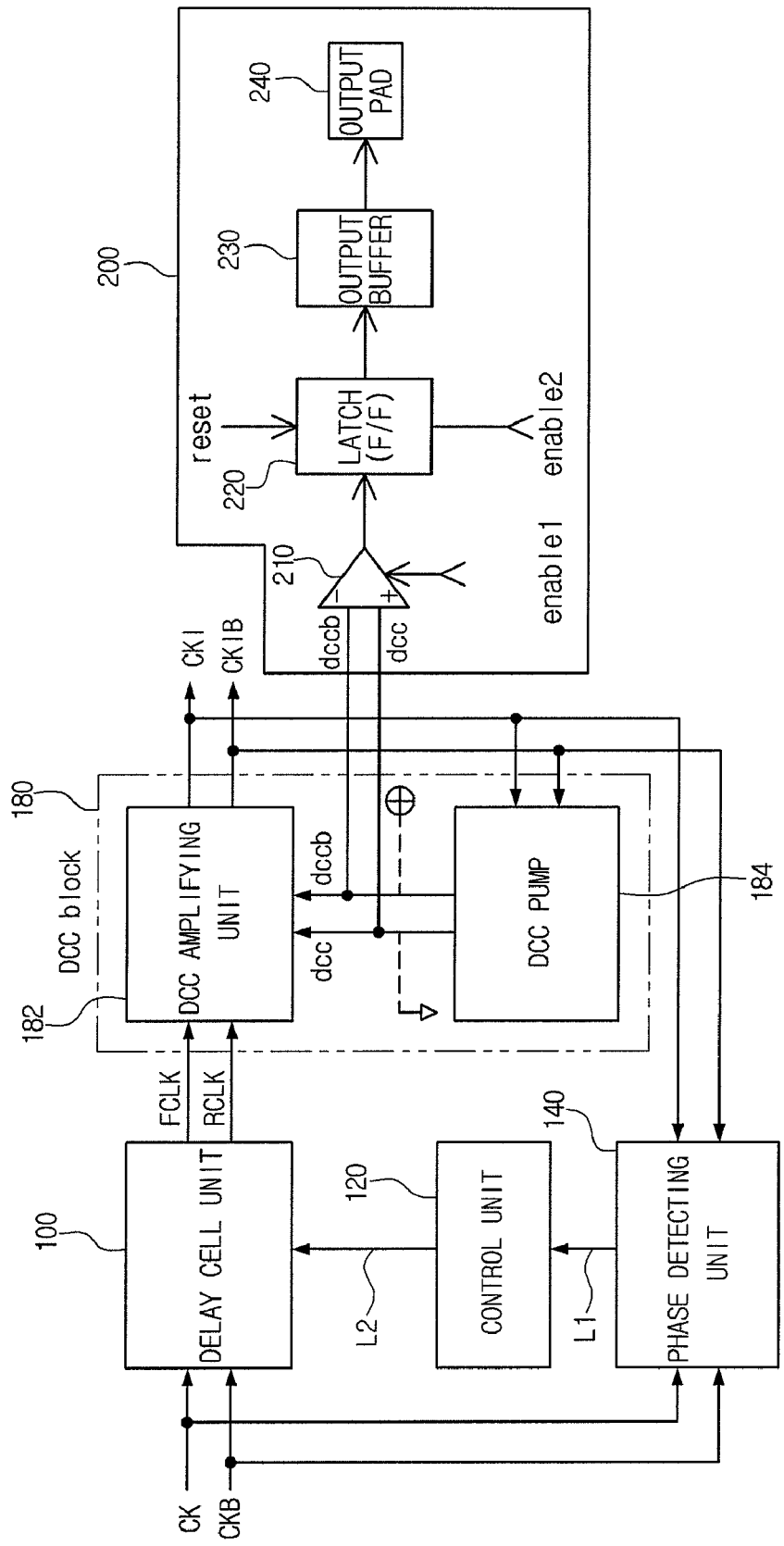
FIG. 3 is a functional block diagram illustrating a delay locked loop circuit according to an exemplary embodiment of the inventive concept.

FIG. 3 is a functional block diagram illustrating a DLL circuit according to an exemplary embodiment of the inventive concept that may be used to reduce these operation errors.

The DLL circuit of FIG. 3 is similar to that of that of FIG. 1, but additionally includes an error detecting unit 200. The error detecting unit 200 compares the voltages of the first and second pumping output nodes dcc and dccb of the duty cycle correcting block 180, latches the comparison result, and outputs the comparison result to an output pad 240 to detect an operation error of the duty cycle correcting block 180.

As shown in FIG. 3, the error detecting unit 200 includes a comparator 210, a latch 220, an output buffer 230, and an output pad 240. The comparator 210 compares the voltages of the first and second pumping output nodes dcc and dccb of the duty cycle correcting block 180 in response to a first enable signal enable1. The latch 220 latches the output of the comparator 210 in response to a second enable signal enable2. The output buffer 230 buffers the output of the latch 220 and applies it to the output pad 240, which may be an external terminal. The error detecting unit 200 may perform a detecting operation in response to the first and second enable signals enable1 and enable2, which may be applied at the wafer level of a semiconductor chip.

When the circuit shown in FIG. 3 is used for a semiconductor device, such as a dynamic random access memory (DRAM) device, the internal clocks (e.g., CKI and CKIB) may be used as the operation clocks of a read and write circuit that reads and writes data from and to memory cells of a memory cell array.

For example, the semiconductor memory device may have a chip including the memory cell array having the memory cells, the DLL circuit shown in FIG. 3, and the read and write circuit that reads and writes data from and to the memory cells of the memory cell array in response to the internal clock of the DLL circuit.

As shown in FIG. 3, the DLL circuit includes the DLL block (e.g., elements 100, 120, and 140) that receives the external clocks CK and CKB and generates delay locked internal clocks CKI and CKIB, the DCC block 180 that is connected to the DLL block and corrects the duty cycles of the internal clocks CKI and CKIB, and the error detecting unit 200 that compares the voltages of the first and second pumping output nodes dcc and dccb of the DCC block 180, latches the comparison result, and outputs the comparison result to an external terminal to detect an operation error of the DCC block 180. The internal clocks CKI and CKIB generated by the DLL block may be derived from delay locked clocks FCLK and RCLK. When the delay locked clocks FCLK and RCLK have a duty ratio of 50%, the delay locked clocks are substantially the same as the internal clocks CKI and CKIB. Therefore, the delay locked clocks may be referred to as the internal clocks CKI and CKIB.

The DCC block 180 corrects the duty ratio by comparing the phase of a rising clock RCLK with the phase of a falling clock FCLK and adjusting the rising periods or the falling periods of the clocks.

The internal clocks CKI and CKIB output from the DCC block 180 are fed back to the DLL circuit. The internal clocks CKI and CKIB may be used as the internal clocks of a synchronous semiconductor memory device, such as a double data rate synchronous DRAM (DDR SDRAM). The synchronous semiconductor device may receive the external clocks CK and CKB from an external controller, perform phase synchronization, and use the internal clocks CKI and CKIB whose duty ratio has been corrected to perform data communication with external apparatuses.

In the error detecting unit 200 shown in FIG. 3, when the first enable signal enable1 is activated, the comparator 210 compares the voltages of the first and second pumping output nodes dcc and dccb of the duty cycle correcting block 180. The latch 220 latches the output of the comparator 210 in response to the second enable signal enable2 and outputs the latched signal. The output buffer 230 connected to the output terminal of the latch 220 buffers the output of the latch 220 and applies the buffered signal to the output pad 240, which may be an external terminal. In this example, test data output to the output pad 240 may have a high or low logic level.

It is assumed that external clocks CK and CKB having a duty ratio of 40% are input to the delay cell unit 100 to describe the error detecting unit 200 shown in FIG. 3. In this example, the common mode level of one of the first and second pumping output nodes dcc and dccb is increased. For example, it is assumed that the voltage of the first pumping output node dcc is higher than that of the second pumping output node dccb. In this example, the comparator 210 outputs a logic signal at a high level, and the logic signal is transmitted to the output pad 240 through the latch 220 and the output buffer 230. For example, the logic signal at a high level is output from the output pad 240 in a test mode of the DCC block 180.

When external clocks CK and CKB having a duty ratio of 60% are input to the delay cell unit 100, the common mode level of the other one of the first and second pumping output nodes dcc and dccb is increased. For example, when the DCC block 180 is normally operated, the voltage of the first pumping output node dcc is lower than that of the second pumping output node dccb since the operation of the DCC block 180 is a reverse to the above-mentioned operation. For example, when the DCC block 180 is normally operated, the level of the test output of the DCC block 180 when the duty ratio of the external clocks CK and CKB is lower than 50% is reverse to that when the duty ratio of the external clocks CK and CKB is higher than 50%.

For example, when external clocks CK and CKB having a duty ratio of 40% are input to the DLL block, and the comparator 210 and the latch 220 of the error detecting unit 200 connected to the duty cycle correcting block 180 are enabled, the voltage of the first pumping output node dcc is higher than that of the second pumping output node dccb. Therefore, a high-level signal is output from an external output pin connected to the output pad 240. Alternately, when external clocks CK and CKB having a duty ratio of 60% are input to the DLL block, and the comparator 210 and the latch 220 of the error detecting unit 200 connected to the duty cycle correcting block 180 are enabled, the voltage of the first pumping output node dcc is lower than that of the second pumping output node dccb. Therefore, a low-level signal is output from the external output pin connected to the output pad 240.

As such, when the output levels in these two examples are reverse to each other, a check is made to determine whether the duty cycle correcting block 180 is operating normally. However, if an operation error occurs in the DCC pump 184 of the DCC block 180 or an error, such as a bridge (e.g., short) between the first and second pumping output nodes dcc and dccb, occurs, one of the output levels may be constant regardless of the duty ratio of the external clocks. In this example, since only one of the high and low levels is output from the output pad, an external check can be performed to determine whether an error occurs in the DCC block 180.

In at least one exemplary embodiment of the invention, a test can be performed even though a clock frequency for the test is not high. Therefore, the test can be performed at the wafer level. Further, a quality index may be improved by detecting the error of the DCC block 180.

The DCC block 180 shown in FIG. 3 may generate various detection patterns. For example, in at least one embodiment, the DCC block 180 may generate a first detection pattern when the duty ratio is 45:55, a second detection pattern when the duty ratio is 50:50, and a third detection pattern when the duty ratio is 55:45.

Even when the duty ratio of the external clocks is reversed, the duty ratio of the output internal clock may be constant with the first and third detection patterns. When an external clock having a duty ratio of 50% is applied, with the DCC block 180 in an off state, and an internal clock having a duty ratio of 50% is obtained with the second detection pattern, it may be determined that an operation error occurs in the DCC block 180. In this example, a short-circuit occurs in a portion of the DCC block 180 and the voltages of the first and second pumping output nodes dcc and dccb may be maintained at a high level.

During mass production, it can be difficult to check whether devices pass the test in a short time. However, when the error detecting unit 200 shown in FIG. 3 is used, the checking of errors may be performed more quickly.

Embodiments of the inventive concept can be applied to semiconductor devices having periodic clocks, and semiconductor devices that include a delay locked loop (DLL). Further, embodiments of the inventive concept may be used in devices that are operated at a high speed.

Although an error detecting unit has been discussed in the above-described exemplary embodiment of the inventive concept, other circuit elements or other connection structures may be used.

According to at least one embodiment of the inventive concept, a mounting error may be prevented by detecting the operation error of the duty cycle correcting block in a delay locked loop circuit.

While exemplary embodiments of the inventive concept have been shown and described with reference to the drawings, it will be understood by one of ordinary skill in the art that various changes in form and details may be made therein without departing from the spirit and scope of the disclosure.

What is claimed is:

1. A delay locked loop circuit comprising:
a delay locked loop block receiving an external clock and generating a delay locked internal clock;
a duty cycle correcting block connected to the delay locked loop block and configured to correct the duty cycle of the internal clock, the duty cycle correcting block including a first pumping output node and a second pumping output node; and
an error detecting unit configured to compare voltages of the first and second pumping output nodes of the duty cycle correcting block and output the comparison result to indicate whether the duty cycle correcting block has an operation error,
wherein the error detecting unit includes:
a comparator configured to compare the voltages of the first and second pumping output nodes of the duty cycle correcting block in response to a first enable signal;
a latch configured to latch the output of the comparator in response to a second enable signal; and
an output buffer configured to buffer an output of the latch and apply the buffered output to an output pad, wherein the output pad is an external terminal.

2. The delay locked loop circuit of claim 1, wherein the delay locked loop block comprises:
a delay cell unit configured to delay the external clock in response to an applied delay control signal;
a phase detecting unit configured to detect a phase difference between the internal clock and the external clock; and
a control unit configured to apply the delay control signal to the delay cell unit in response to an output of the phase detecting unit.

3. The delay locked loop circuit of claim 1, wherein the duty cycle correcting block comprises:
a duty cycle correction amplifying unit configured to correct the duty cycle of the internal clock output from the delay locked loop block in response to an applied correction control signal; and
a duty cycle correction pumping unit configured to receive the corrected internal clock output from the duty cycle correction amplifying unit and output the correction control signal.

4. The delay locked loop circuit of claim 1, wherein the error detecting unit is enabled in response to an enable signal that is applied at a wafer level of a semiconductor chip.

5. A semiconductor memory device comprising:
a memory cell array including memory cells;
a delay locked loop circuit comprising:
a delay locked loop block that receives an external clock and generates a delay locked internal clock;
a duty cycle correcting block that is connected to the delay locked loop block and corrects the duty cycle of the internal clock, wherein the duty cycle correcting block includes a first pumping output node and a second pumping output node; and
an error detecting unit that compares voltages of the first and second pumping output nodes of the duty cycle correcting block, latches the comparison result, and outputs the comparison result to an external terminal to detect an operation error of the duty cycle correcting block; and
a read and write circuit configured to read and write data from and to the memory cells of the memory cell array in response to the internal clock of the delay locked loop circuit,
wherein the memory cell is a dynamic random access memory cell, and the error detecting unit is enabled in response to an enable signal that is applied at a wafer level of a semiconductor chip.

6. The semiconductor memory device of claim 5, wherein the delay locked loop block includes:
a delay cell unit configured to delay the external clock in response to an applied delay control signal;
a phase detecting unit configured to detect a phase difference between the internal clock and the external clock; and a control unit configured to apply the delay control signal to the delay cell unit in response to an output of the phase detecting unit.

7. The semiconductor memory device of claim 5, wherein the duty cycle correcting block includes:
a duty cycle correction amplifying unit configured to correct the duty cycle of the internal clock output from the delay locked loop block in response to an applied correction control signal; and
a duty cycle correction pumping unit configured to receive the corrected internal clock output from the duty cycle correction amplifying unit and output the correction control signal.

8. The semiconductor memory device of claim 5, wherein the error detecting unit includes:
a comparator configured to compare voltages of the first and second pumping output nodes of the duty cycle correcting block in response to a first enable signal;
a latch configured to latch an output of the comparator in response to a second enable signal; and
an output buffer configured to buffer an output of the latch and apply the buffered output to an output pad, wherein the output pad is the external terminal.

9. The semiconductor memory device of claim 5, wherein the memory cell array is a double data rate synchronous DRAM.

10. The semiconductor memory device of claim 5, wherein the memory cells are DRAM cells.

11. A delay locked loop (DLL) circuit comprising:
a delay cell unit configured to receive a first clock signal and a second clock signal, delay the first and second clock signals, and output corresponding first and second delayed signals, wherein the second clock signal is an inverted version of the first clock signal;
an amplifying unit configured to correct the first delayed signal in response to a first correction signal and to correct the second delayed signal in response to a second correction signal and output corresponding first and second corrected clock signals;
a charge pump configured to generate the first and second correction signals in response to previous outputs of the amplifying unit and output the first correction signal to the amplifying unit along a first line to the amplifying unit and output the second correction signal to the amplifying unit along a second and distinct line to the amplifying unit;
a phase detection unit configured to detect a second phase difference between the first clock signal and the first corrected clock signal, to detect a first phase difference between the second clock signal and the second corrected clock signal, and to output the first and second phase differences to the delay cell unit; and
an error detection circuit configured to determine and indicate whether the first line is shorted to the second line.

12. The DLL circuit of claim 11, wherein the error detection circuit comprises a comparator connected to the first line and the second line, and configured to compare voltages of the first and second line, and output a result of the comparison to indicate whether a duty cycle of the first and second corrected clock signals is offset from a duty cycle of the first and second clock signals.

13. The DLL circuit of claim 12, wherein the comparator is configured to be one of disabled or enabled in response to a first enable signal.

14. The DLL circuit of claim 13, wherein the first enable signal is applied at a wafer level of a semiconductor chip.

15. The DLL circuit of claim 12, wherein the error detection circuit further comprises:
a latch configured to latch the result of the comparison; and
an output buffer configured to receive an output of the latch in response to a second enable signal.

16. The DLL circuit of claim 15, wherein the error detection circuit further comprises output pad configured to receive an output of the output buffer.

17. The DLL circuit of claim 11, wherein the amplifying unit and the charge pump are configured to maintain the duty ratio of the first and second corrected clock signals at 50%.

18. The DLL circuit of claim 11, wherein delay cell unit is configured to delay the first clock signal and the second clock signal in response to an applied delay control signal, and the DLL circuit further includes a control unit configured to apply the delay control signal to the delay cell unit in response to an output of the phase detection unit.

19. A delay locked loop circuit comprising:
a delay locked loop block receiving an external clock and generating a delay locked internal clock;
a duty cycle correcting block connected to the delay locked loop block and configured to correct the duty cycle of the internal clock, the duty cycle correcting clock including a first pumping output node and a second pumping output node; and
an error detecting unit configured to compare voltages of the first and second pumping output nodes of the duty cycle correcting block and output the comparison result to indicate whether the duty cycle correcting block has an operation error,
wherein the error detecting unit is enabled in response to an enable signal that is applied at a wafer level of a semiconductor chip.

20. A delay locked loop circuit comprising:
a delay locked loop block receiving an external clock and generating a delay locked internal clock;
a duty cycle correcting block connected to the delay locked loop block and configured to correct the duty cycle of the internal clock, the duty cycle correcting clock including a first pumping output node and a second pumping output node; and
an error detecting unit configured to compare voltages of the first and second pumping output nodes of the duty cycle correcting block and output the comparison result to indicate whether the duty cycle correcting block has an operation error,
wherein the error detecting unit includes:
a comparator configured to compare the voltages of the first and second pumping output nodes of the duty cycle correcting block in response to a first enable signal; and
a latch configured to latch the output of the comparator in response to a second enable signal.

* * * * *